(12) United States Patent
Suenaga et al.

(10) Patent No.: US 7,015,575 B2
(45) Date of Patent: Mar. 21, 2006

(54) LSI PACKAGE

(75) Inventors: Hiroshi Suenaga, Osaka (JP);
 Yoshiyuki Saito, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/835,824

(22) Filed: Apr. 30, 2004

(65) Prior Publication Data
 US 2004/0256717 A1 Dec. 23, 2004

(30) Foreign Application Priority Data
 May 22, 2003 (JP) ............................. 2003-144606

(51) Int. Cl.
 *H01L 23/52* (2006.01)
 *H01L 23/48* (2006.01)
(52) U.S. Cl. .................. 257/700; 257/698; 257/691; 257/778; 257/666; 257/692
(58) Field of Classification Search ............... 257/690, 257/691, 697, 700, 701, 698, 699, 771, 779, 257/781, 778, 692, 666
 See application file for complete search history.

(56) References Cited

U.S. PATENT DOCUMENTS 5,883,427 A * 3/1999 Arimoto ................. 257/690
6,707,146 B1 * 3/2004 Terui et al. ............. 257/691

FOREIGN PATENT DOCUMENTS

JP 2001-35952 2/2001

* cited by examiner

*Primary Examiner*—Nathan J. Flynn
*Assistant Examiner*—Fazli Erdem

(57) ABSTRACT

According to LSI packages of the BGA type and the like, the number of source voltage supply terminals on an LSI package needs to be around the same as the number of power supply terminals on an LSI chip, in order to prevent the impact of high-frequency currents generated due to a switching operation in an internal circuit in the LSI chip. According to the present invention, however, at least two power supply terminals on an LSI chip are connected to one source voltage supply terminal on an LSI package. In addition, a capacitor element is embedded in a substrate forming the main body of the LSI package, and the capacitor element is provided between a source voltage supply terminal and an earth terminal.

10 Claims, 5 Drawing Sheets

LSI PACKAGE

BACKGROUND OF THE INVENTION (1) Field of the Invention

The present invention relates to an Large Scale Integration (LSI) packaging technology.

(2) Prior Art

The number of pins in an LSI has been recently on the rise in accordance with a demand for more sophisticated LSIs. On the other hand, a miniaturized package is desired for LSIs in accordance with a demand for miniaturized devices and boards. For this reason, Ball Grid Array (BGA) types shown in FIG. 9A and FIG. 9B and Chip Size Packages (CSPs) have replaced Quad Flat Packages (QFPs) shown in FIG. 8A and FIG. 8B. According to CSP types, the size of an LSI package is substantially the same as that of an LSI chip. According to BGA and CSP LSI packaging technologies, terminals (solder balls) to be connected to the wiring of printed-wiring boards are arranged in a grid pattern on a back surface of an LSI package.

In LSI packages of BGA and CSP, solder balls located near the periphery can be connected, by wires, to the wiring formed on the mounting surface of a printed-wiring board. However, solder balls located in the center part need to be connected to the wiring in an internal layer or a back surface of the printed-wiring board through vias.

A plurality of solder balls on an LSI chip included in an LSI package of the above-mentioned types are disposed as power supply terminals, and at the same electric potential. On an LSI package with such an LSI chip, a plurality of solder balls at the same electric potential are provided as source voltage supply terminals, which are electrically connected to the solder balls on an LSI chip in one-to-one correspondence.

If a switching operation occurs in circuits connected to power supply terminals on an LSI chip in an LSI package, high-frequency currents are generated. To reduce the impact of noise caused by high-frequency currents, it is known to provide an anti-noise unit such as a capacitor element with an LSI package. More specifically, power supply pins and ground pins on an LSI chip are respectively connected to source voltage supply terminals and ground terminals on an LSI package, in such a manner that capacitor elements are disposed between a pin and a terminal. Thus, high-frequency currents are absorbed by capacitor elements. (see Japanese laid-open patent application publication 2001-35952)

If the number of source voltage supply terminals at the same electric potential on an LSI package of the above-mentioned types is reduced, a pitch of terminals as a whole (including signal terminals) on an LSI package can be more or less increased. This makes it easier to connect terminals on an LSI package with wiring.

Here, the number of source voltage supply terminals on the LSI package can be reduced in the following manner. One source voltage supply terminal on an LSI package is electrically connected to a plurality of power supply terminals on an LSI chip. However, when a switching operation occurs in circuits connected to the power supply terminals on the LSI chip, high-frequency currents are generated, and flow into the single source voltage supply terminal on the LSI package. If a switching operation occurs in more than one circuits at a time, a large amount of high-frequency currents are generated. This causes too large a voltage fall in a voltage at the single source voltage supply terminal to be ignored. For example, even though 3.3 V is supplied to an external side of the source voltage supply terminal, only 3.0 V is measured at an internal side of the source voltage supply terminal. Consequently, the power supply terminals on the LSI chip are not supplied with a sufficiently high voltage.

In the light of the above-mentioned problem, it is the object of the present invention to provide an LSI package which maintains the size equal to that of a conventional LSI package, achieves a steady voltage supply with an LSI chip, and have a smaller number of source voltage supply terminals than in the related art.

SUMMARY OF THE INVENTION

The above-mentioned object can be achieved by an LSI package comprising a substrate, an LSI chip that is mounted on or embedded in the substrate, a plurality of power supply terminals that are provided on the LSI chip, one or more source voltage supply terminals which are provided on one of main surfaces of the substrate, and whose number is smaller than a number of the plurality of power supply terminals, and a capacitor element which is embedded in the substrate and a first end of which is earthed, wherein at least one of the source voltage supply terminals is connected to at least two of the plurality of power supply terminals on the LSI chip, in such a manner that a power supply path connected to the at least one source voltage supply terminal branches into at least two power supply paths in the substrate, and a second end of the capacitor element is connected to the power supply path at a point before the power supply path branches.

Here, at least one of the plurality of power supply terminals requires a direct-current voltage of a different level than a direct-current voltage applied to a rest of the power supply terminals, and the at least one power supply terminal is connected, through a direct-current voltage conversion element that is embedded in or mounted on the substrate, to one of the source voltage supply terminals to which a different power supply terminal is also connected.

Here, an inductance element is embedded in the substrate, in such a manner that the inductance element is disposed between (i) an electrode at the second end of the capacitor element and (ii) the at least one source voltage supply terminal so as to be connected to the electrode and the at least one source voltage supply terminal.

Here, the LSI chip is embedded in the substrate, and a first conductive board is provided, in the substrate, above the LSI chip and the capacitor element, and connected to earth terminals provided in the substrate.

Here, a second conductive board is provided, in the substrate, below the LSI chip and the capacitor element, so as to oppose the first conductive board, and the first conductive board is connected to the second conductive board by a plurality of vias that run through the substrate and are arranged near a periphery of the substrate.

Here, the substrate is composed of a first layer formed by a multilayer circuit board, a second layer formed by a board, and a third layer formed by a board, the LSI chip is mounted on one surface of the multilayer circuit board of the first layer, and the at least two power supply paths are integrated into the power supply path in the multilayer circuit board of the first layer, the capacitor element is embedded in the board of the second layer that is provided on other surface of the multilayer circuit board of the first layer, and the board of the third layer is provided on one surface of the board of the second layer, and the source voltage supply terminals are provided on one surface of the board of the third layer.

Here, the board of the second layer is formed by layering a plurality of thermosetting resin films on one another, and a depression is formed in the board of the second layer to embed the capacitor element.

An LSI package comprising a substrate, an LSI chip that is mounted on or embedded in the substrate, a plurality of power supply terminals on the LSI chip, and one or more source voltage supply terminals which are provided on one of main surfaces of the substrate, and whose number is smaller than a number of the plurality of power supply terminals, wherein a power supply path connected to at least one of the source voltage supply terminals branches into at least two power supply paths in the substrate, so as to be connected to at least two of the power supply terminals on the LSI chip, and a capacitor element is embedded in the substrate, connected to at least one of the at least two power supply paths at a first end thereof, and earthed at a second end thereof.

Here, an LSI package comprising a substrate, an LSI chip that is mounted on or embedded in the substrate, a plurality of power supply terminals that are provided on the LSI chip, one or more source voltage supply terminals which are provided on one of main surfaces of the substrate, and whose number is smaller than a number of the plurality of power supply terminals, and a plurality of capacitor elements which are embedded in the substrate, wherein at least one of the source voltage supply terminals is connected to at least two of the power supply terminals, and each of the at least two power supply terminals and a corresponding earth terminal are directly connected to electrodes at both ends of one of the capacitor elements respectively.

Here, a distance between the power supply terminal and the corresponding earth terminal is set so as to be equal to a distance between the electrodes at the both ends of the capacitor element, and the power supply terminal and the corresponding earth terminal are directly connected to the electrodes respectively using a conductive bump.

Here, the at least one source voltage supply terminal is connected to the at least two power supply terminals on the LSI chip, in such a manner that a power supply path connected to the source voltage supply terminal branches into at least two power supply paths in the substrate.

Here, the substrate includes a board and a multilayer circuit board, the LSI chip is mounted on one surface of the board and the plurality of capacitor elements are embedded in the board, and the multilayer circuit board is provided on other surface of the board, the source voltage supply terminals are provided on the multilayer circuit board, and power supply path connected to the at least two power supply terminals are integrated into one power supply path in the multilayer power board.

Here, the LSI chip and the board are covered by resin.

According to an LSI package having the above-mentioned construction, high-frequency currents generated by a switching operation in an internal circuit in an LSI chip flow into power supply terminals on an LSI chip. However, the high-frequency currents flow into earth through a capacitor element. In addition, since the voltage at the capacitor element is applied to the power supply terminals on the LSI chip, the voltage at the power supply terminals does not fall. Similarly, since the high-frequency currents do not flow into source voltage supply terminals on the LSI package, the voltage at the source voltage supply terminals does not fall either. As a result, a steady voltage is supplied with the power supply terminals on the LSI chip. Thus, the number of source voltage supply terminals on the LSI package can be reduced so as to be smaller than the number of power supply terminals on the LSI chip. Accordingly, a pitch of terminals as a whole (including signal terminals) on the LSI package is more or less increased. As a result, board manufacturing can be made easier without increasing the size of the surface of the LSI package on which terminals are to be provided.

Also, since the capacitor element is directly connected to the terminals on the LSI chip, a path for the high-frequency currents can be made remarkably short. This effectively suppresses unnecessary electromagnetic radiation.

Since a direct-current voltage conversion element is provided, a different voltage can be applied to some of the terminals on the LSI chip.

Since an inductance element is provided, unnecessary electromagnetic radiation can be suppressed more effectively, and noise from outside can be prevented.

Since a conductive board is provided and essential elements such as the LSI chip are enclosed by vias, unnecessary electromagnetic radiation from the LSI package can be reduced and radiation noise from outside can be prevented.

BRIEF DESCRIPTION OF THE DRAWINGS

These and the other objects, advantages and features of the invention will become apparent from the following description thereof taken in conjunction with the accompanying drawings which illustrate a specific embodiment of the invention.

In the drawings.

DESCRIPTION OF THE PREFERRED EMBODIMENTS

The following part describes LSI packages relating to embodiments of the present invention with reference to the attached figures. The attached figures show the cross sections of the LSI packages, and do not include hatchings for better understanding of the construction.

Figure 1:
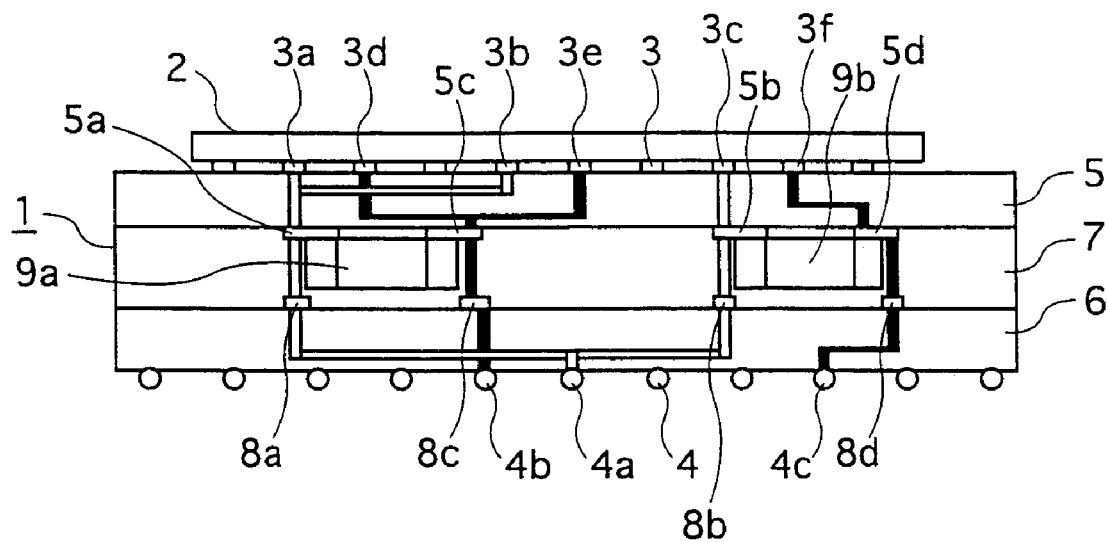
FIG. 1 is a cross-sectional view illustrating a construction of an LSI package relating to an embodiment of the present invention.

As shown in FIG. 1, an LSI package is constituted by a substrate 1 forming the main body of the LSI package and an LSI chip 2. A plurality of bumps are arranged in a grid pattern, as terminals 3, on the LSI chip 2. A plurality of solder balls are arranged in a grid pattern, as terminals 4, on one surface of the substrate 1. The terminals 3 and 4 include signal input/output terminals, power supply terminals, and earth terminals. Signal input/output terminals are not directly related to the present invention, and therefore not explained here.

The substrate 1 has a three-layer construction, which includes a multilayer circuit board 6 on which the terminals 4 are provided, a multilayer circuit board 5 on which the LSI chip 2 is mounted, and a thermosetting resin board 7 which is adhered to each of the multilayer circuit boards 5 and 6.

In more detail, a source voltage supply terminal 4a is provided on one surface of the multilayer circuit board 6 so as to be externally exposed. The source voltage supply terminal 4a branches inside the multilayer circuit board 6, and is connected to terminals 8a and 8b which are provided on the other surface of the multilayer circuit board 6. Two earth terminals 4b and 4c are provided on one surface of the multilayer circuit board 6 so as to be externally exposed. The earth terminals 4b and 4c go through the multilayer circuit board 6, and are respectively connected to terminals 8c and 8d which are provided on the other surface of the multilayer circuit board 6. Electric pathways in the multilayer circuit board 6 include vias running vertically and power supply paths running horizontally. Multilayer circuit boards to be explained in the following part have the same construction as the above-mentioned construction. The LSI packages relating to embodiments of the present invention include one or more multilayer circuit boards which are widely and commonly used.

The terminals 8a, 8b, 8c, and 8d run through the thermosetting resin board 7, and are respectively connected to terminals 5a, 5b, 5c and 5d provided on one surface of the multilayer circuit board 5. Terminals of capacitor elements 9a and 9b are respectively disposed between the terminals 5a and 5c, and between the terminals 5b and 5d. The terminal of the capacitor element 9a is directly connected to the terminals 5a and 5c, and the terminals of the capacitor elements 9b to 5b and 5d. The capacitor elements 9a and 9b are embedded in the thermosetting resin board 7. The terminals 5a and 5c respectively branch into two paths inside the multilayer circuit board 5, and are respectively connected to power supply terminals 3a and 3b, and earth terminals 3d and 3e on the LSI chip 2. Also, the terminals 5b and 5d go through the multilayer circuit board 5, and are respectively connected to a power supply terminal 3c and an earth terminal 3f on the LSI chip 2. The power supply terminals 3a, 3b and 3c supply the same power voltage with the LSI chip 2. Here, each of the capacitor elements 9a and 9b is connected to a power supply terminal on the LSI chip 2 at its one end, and to an earth terminal on the LSI chip 2 at its other end. Thus, a condenser unit is formed.

The following part briefly describes how to manufacture the LSI package shown in FIG. 1. The multilayer circuit boards 5 and 6 are prepared. A multilayer circuit board including vias and wiring therein has been widely known. The capacitor element 9a is electrically and mechanically connected, using solders or the like, to the terminals 5a and 5c on the multilayer circuit board 5 at its electrodes respectively. The capacitor element 9b is connected to the terminals 5b and 5d in the same manner.

After this, a plurality of thermosetting resin films (not completely cured and therefore soft) are layered on one another, and united. Then, depressions are formed in the united thermosetting resin films so as to embed the capacitor elements 9a and 9b. A via is formed in the following manner. A through-hole is formed at a position where a via is to be formed, and a conductive paste is poured into the through-hole. The capacitor elements 9a and 9b, which have been disposed on the multilayer circuit board 5, are covered by the thermosetting resin board 7 that has been manufactured as described above. Then, the thermosetting resin board 7 is sandwiched by the multilayer circuit boards 5 and 6, and the result is heated so as to become united. Lastly, the LSI chip 2 is mounted on the multilayer circuit board 5. The above-mentioned manufacturing method for the thermosetting resin board 7 is publicly known.

As described above, the three power supply terminals 3a, 3b and 3c on the LSI chip 2 correspond to one source voltage supply terminal 4a on the LSI package. Thus, the source voltage supply terminal 4a supplies a direct-current voltage to each of the power supply terminals 3a, 3b and 3c.

When a switching operation occurs in internal circuits in the LSI chip 2 which are connected to the power supply terminals 3a, 3b and 3c, high-frequency currents are generated at the terminals 3a, 3b and 3c. The high-frequency currents flow into earth through the capacitor elements 9a and 9b. In other words, the high-frequency currents do not flow into the source voltage supply terminal 4a, and only a direct-current electricity flows into the source voltage supply terminal 4a. Accordingly, the high-frequency currents do not cause the voltage at the source voltage supply terminal 4a to drop. As a result, a direct-current voltage supplied with the source voltage supply terminal 4a can be supplied with the power supply terminals 3a, 3b and 3c on the LSI 2 as it is. At the same time, as the voltage accumulated in the capacitor elements 9a and 9b is applied to the power supply terminals 3a, 3b and 3c on the LSI chip 2, the power supply terminals 3a, 3b, and 3c are supplied with a steady voltage.

Conventionally, the number of source voltage supply terminals on an LSI package is required to be the same as that of power supply terminals on an LSI chip. According to the present embodiment, however, the power supply terminals 3a, 3b and 3c requires only one source voltage supply terminal on the LSI package, i.e. the terminal 4a. In other words, the number of source voltage supply terminals on an LSI package can be reduced. Thus, a pitch of terminals can be, more or less, increased without increasing the size of an LSI package.

According to the present invention, the number of the source voltage supply terminals on the LSI package is set smaller than that of the power supply terminals on the LSI chip 2. Capacitor elements can be provided as needed, but it is desirable to provide as few as capacitor elements for the sake of a space.

Here, an inductance element may be provided between the source voltage supply terminal 4a and one of the terminals 5a and 8a. In this way, the above-mentioned high-frequency currents can be prevented from flowing into the source voltage supply terminal 4a. In addition, high-frequency currents from outside are prevented from flowing into the LSI package through the source voltage supply terminal 4a.

When a direct-current voltage of a different level needs to be applied to some of the power supply terminals on the LSI chip 2, for example, a direct-current voltage of 5 V to the power supply terminals 3a and 3b, and a direct-current voltage of 3.3 V to the power supply terminal 3c, a direct-current voltage conversion element is provided between the source voltage supply terminal 4a and the terminal 3c, and a direct-current voltage of 5 V is supplied to the terminal 4a.

Here, the direct-current voltage conversion element is a circuit element to change a level of a direct-current voltage. In this case, it converts the level of the voltage from 5 V to 3.3 V. In this way, only one source voltage supply terminal is necessary on the LSI package for three power supply terminals on the LSI chip 2.

The embodiment shown in FIG. 1, and additions and modifications to the same may correspond to the following embodiments as appropriately.

Figure 2:
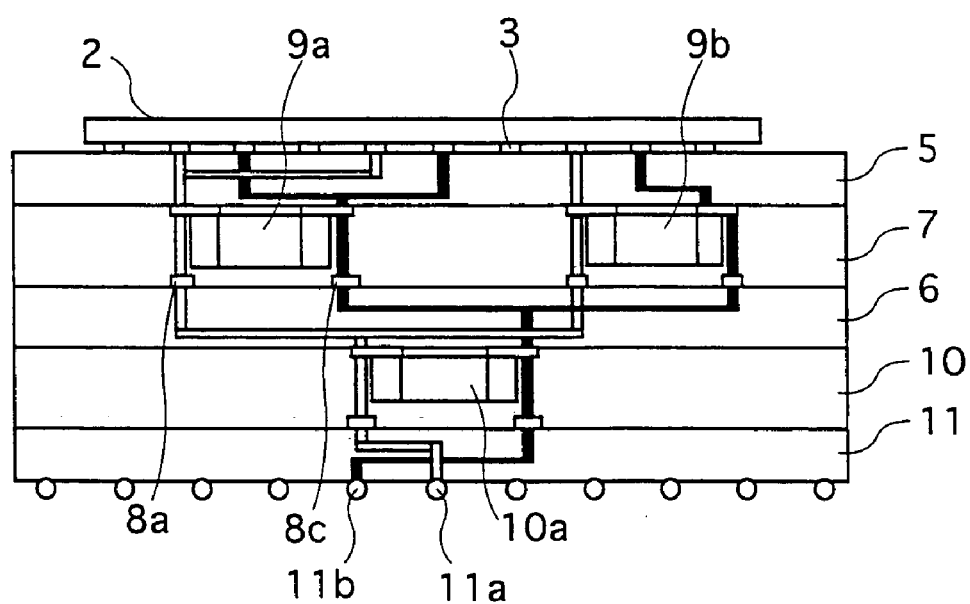
FIG. 2 is a cross-sectional view illustrating a construction of an LSI package relating to a different embodiment of the present invention.

An LSI package shown in FIG. 2 includes boards 10 and 11, and a capacitor element 10a on the board 10 in addition to the constituents of the LSI package shown in FIG. 1. The capacitor element 10a is provided to reduce the impact of high-frequency currents more dramatically. A source voltage supply terminal 11a is equivalent to the source voltage supply terminal 4a, and an earth terminal 11b to the earth terminals 4b and 4c.

Figure 3:
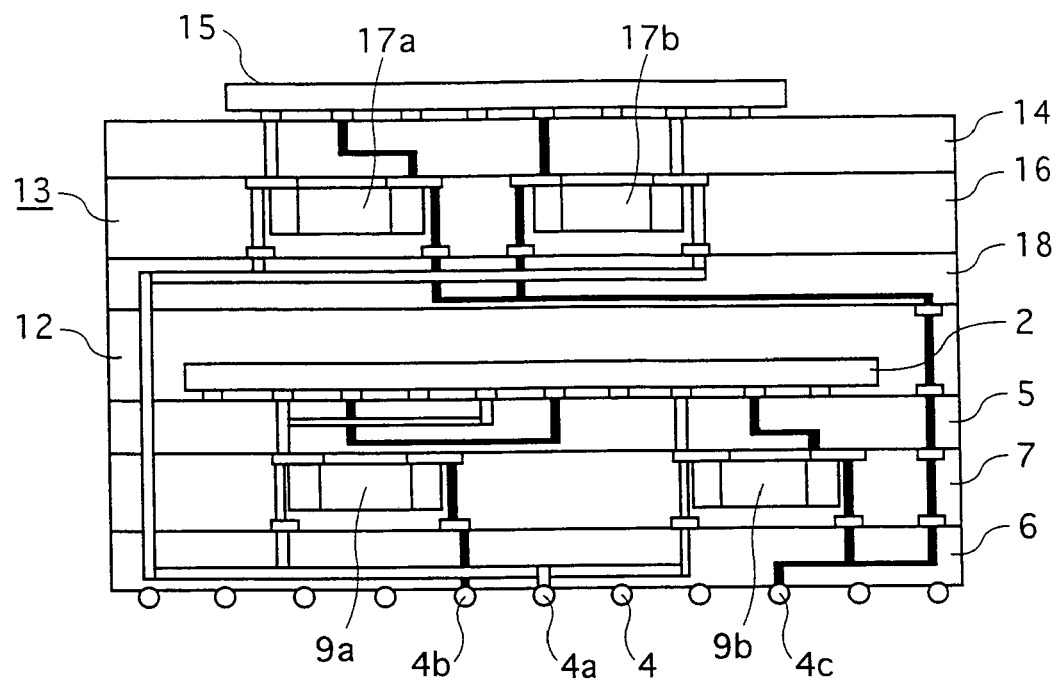
FIG. 3 is a cross-sectional view illustrating a construction of an LSI package relating to a different embodiment of the present invention.

According to an LSI package shown in FIG. 3, the LSI chip 2 shown in FIG. 1 is embedded in aboard 12, and another three-layer board 13 is placed on the board 12. More specifically, the board 13 has the following construction. An LSI chip 15 is mounted on a multilayer circuit board 14, two capacitors 17a and 17b are embedded in a board 16, and two power supply circuits are integrated into one power supply circuit in a multilayer circuit board 18. The one power supply circuit is connected to the source voltage supply terminal 4a and the earth terminal 4c through the boards 12, 5, 7, and 6.

The LSI package shown in FIG. 3 has a layer structure including two layers each of which is composed of an LSI chip, a board including a capacitor element, and a board including a power supply path. This construction enables a more effective LSI having a small size to be achieved.

Figure 4:
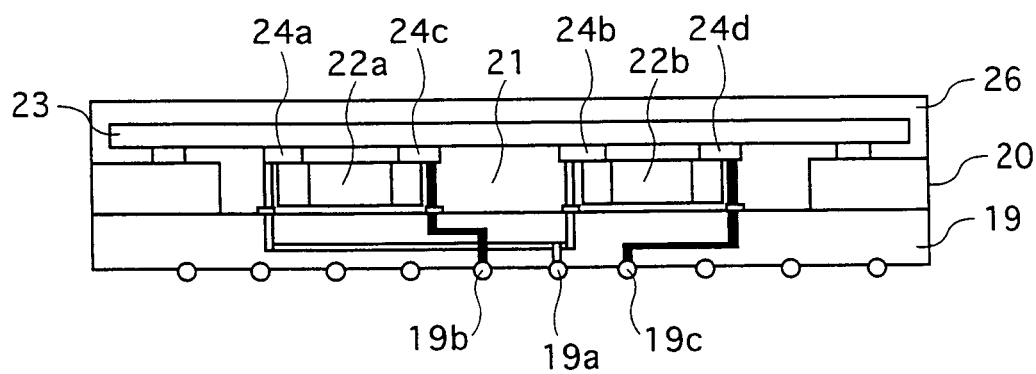
FIG. 4 is a cross-sectional view illustrating a construction of an LSI package relating to a different embodiment of the present invention.

An LSI package shown in FIG. 4 is the same as the one shown in FIG. 1 in terms of, for example, the functions of the capacitor elements and that the number of source voltage supply terminals on the LSI package is set smaller than that of power supply terminals on the LSI chip. Accordingly, no explanation on these common characteristics is provided here.

Figure 5:
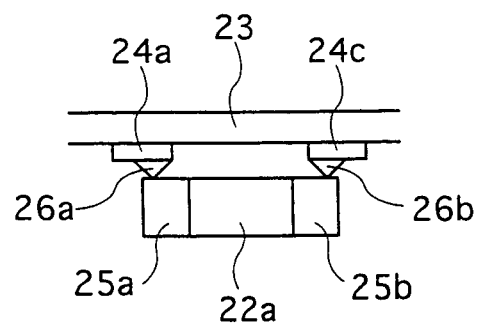
FIG. 5 is a cross-sectional view illustrating a construction of a part of the LSI package shown in FIG. 4.

In the following part, the construction of the LSI package shown in FIG. 4 is described in detail. A source voltage supply terminal 19a, and earth terminals 19b and 19c are provided on a multilayer circuit board 19 in which power supply paths have been formed. Capacitor elements 22a and 22b are placed in a depression 21, which has been created by removing part of a board 20. An LSI chip 23 is mounted on the board 20. The capacitor element 22a is electrically and mechanically connected, at its electrodes, directly to a power supply terminal 24a and an earth terminal 24c on the LSI chip 23. The capacitor element 22b is connected to a power supply terminal 24b and an earth terminal 24d in the same manner. This construction is achieved in the manner shown in FIG. 5.

Taking the capacitor element 22a as an example, an inter-terminal distance between the terminals 24a and 24c is set in accordance with a distance between electrodes 25a and 25b respectively at both ends of the capacitor element 22a. Then, the terminals 24a and 24c are respectively connected to the electrodes 25a and 25b using conductive bumps 26a and 26b. The conductive bumps maybe replaced with conductive adherent agents.

According to FIG. 4, the LSI chip 23 and the capacitor elements 22a and 22b are covered by a resin forming a board 26. Since the capacitor elements 22a and 22b are directly connected to the terminals 24a and 24c, and 24b and 24d on the LSI chip 23 as described above, the capacitor elements and the corresponding terminals are connected to each other with the shortest distance therebetween. This shortens a propagation path of high-frequency currents, thereby suppressing unnecessary electromagnetic radiation more effectively.

Figure 6:
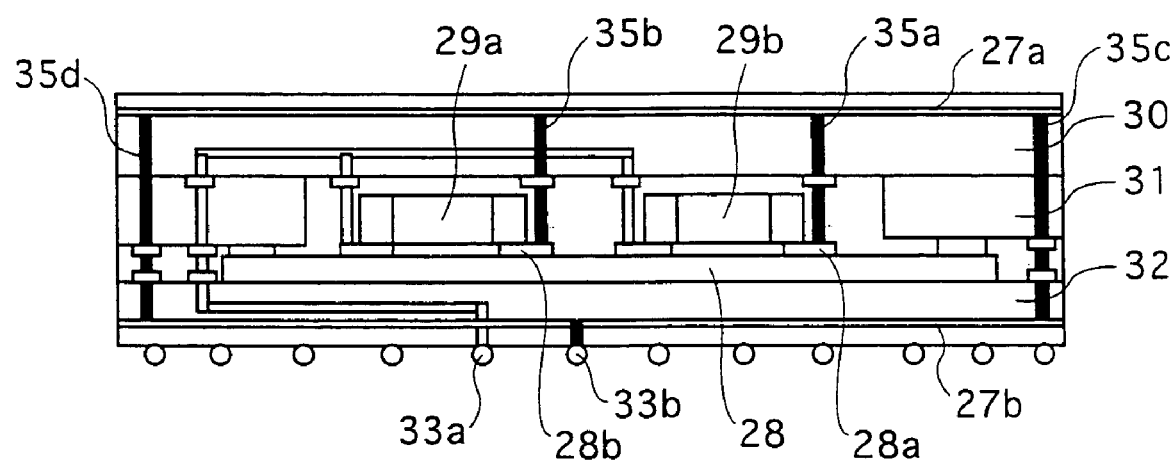
FIG. 6 is a cross-sectional view illustrating a construction of an LSI package relating to a different embodiment of the present invention.

An LSI package shown in FIG. 6 is characterized in the following respect. An LSI chip 28, capacitor elements 29a and 29b, a board 30 including power supply paths, a board 31 on which the LSI chip 28 is mounted, and a multilayer circuit board 32 are sandwiched by conductive boards 27a and 27b. Reference numerals 33a and 33b respectively indicate a source voltage supply terminal and an earth terminal. The earth terminal 33b is connected to the conductive board 27b, and also to the conductive board 27a by vias 35c and 35d. Earth terminals 28a and 28b on the LSI chip 28 are directly connected to the conductive board 27a by vias 35a and 35b respectively. This enables the earth terminals 28a and 28b to be earthed more reliably than getting them earthed through an earth circuit in the multilayer circuit board 30. According to the above-mentioned construction, the conductive boards 27a and 27b prevent unnecessary electromagnetic radiation from the LSI package, and also stop electromagnetic noise from going into the LSI package from outside. Regarding the LSI chip 28, the capacitor elements 29a and 29b, and the number of and the wiring paths for the power supply terminals, the LSI package shown in FIG. 6 is based on the combination of the LSI packages shown in FIGS. 1 and 4. Therefore, the LSI package shown in FIG. 6 produces the same effects as the LSI packages shown in FIGS. 1 and 4, except for the effects of the conductive boards 27a and 27b.

Figure 7:
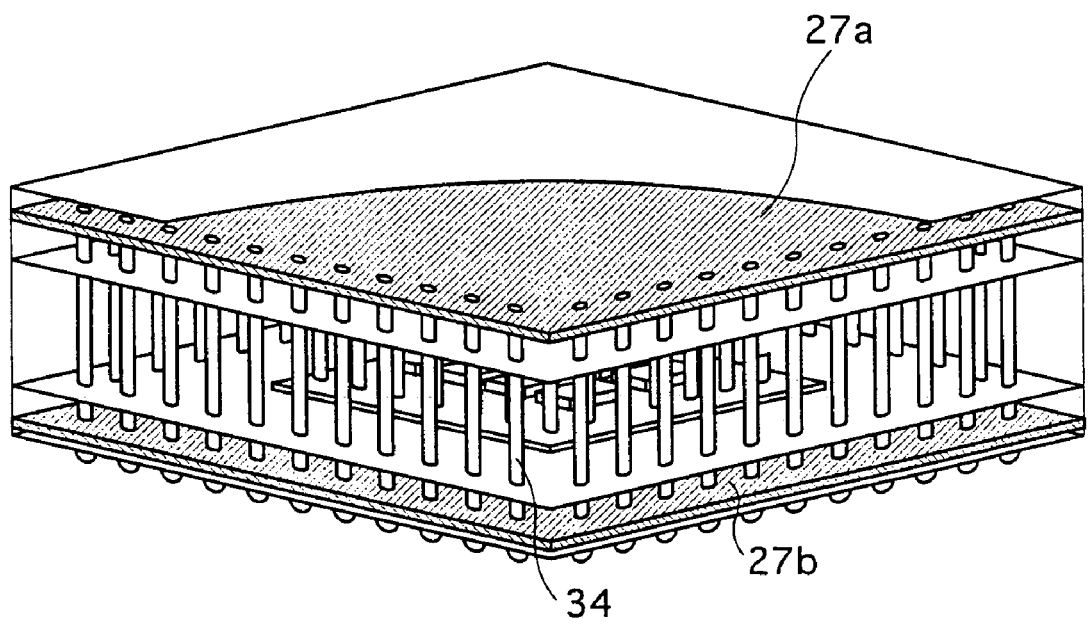
FIG. 7 is a perspective view illustrating the inside of the LSI package shown in FIG. 6 by removing part of the LSI package.
Figure 8A:
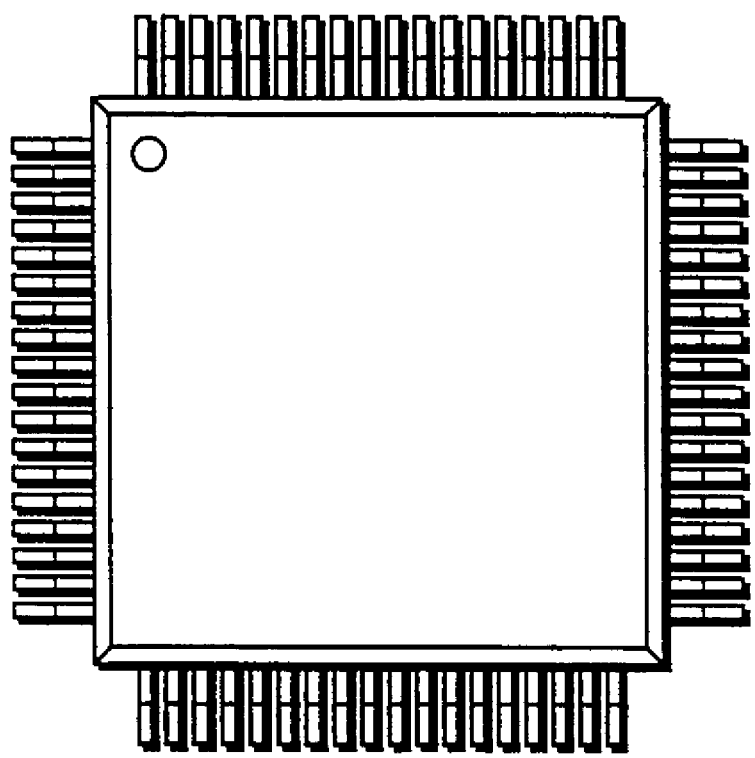
FIG. 8A is a plan view illustrating an LSI package of a QFP type.
Figure 8B:
FIG. 8B is a front view illustrating an LSI package of a QFP type.
Figure 9A:
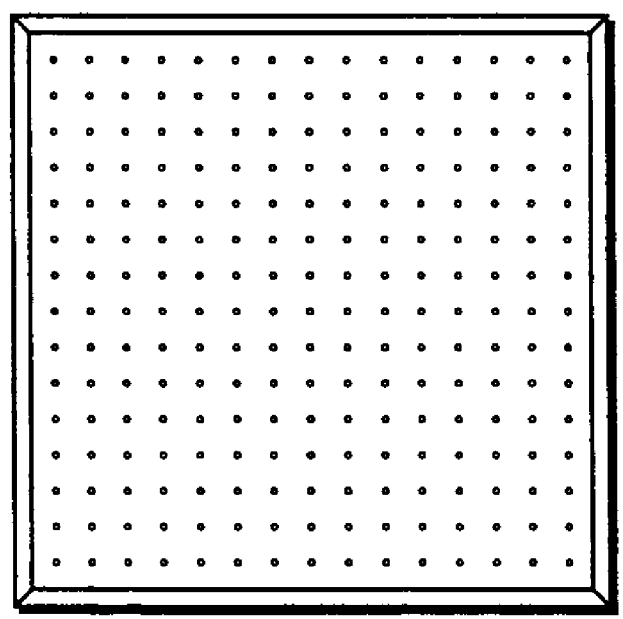
FIG. 9A is a plan view illustrating an LSI package of a BGA or CSP type.
Figure 9B:
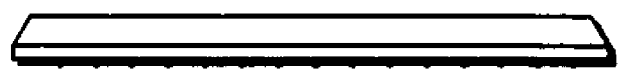
FIG. 9B is a front view illustrating an LSI package of a BGA or CSP type.

FIG. 7 is a perspective view illustrating the LSI package shown in FIG. 6, and shows the inside of the LSI package by removing a part of it. As shown in FIG. 7, the earth terminals are connected to the conductive boards 27a and 27b, and the LSI package is characterized in that a plurality of vias 34 are provided near the periphery of the conductive boards 27a and 27b, so as to form an enclosure. The enclosure of the vias 34 may be formed not to enclose all of the constituents of the LSI package, but to enclose only essential internal constituents, for example, an LSI chip or a capacitor element. The vias 34 and the conductive boards 27a and 27b produce a strong shielding effect. The vias 34 are preferably arranged in the vicinity of and along signal wiring inside the LSI package. This enables feedback paths of signals to be as short as possible.

As described above, an embodiment of the present invention is an LSI package comprising a substrate, an LSI chip that is mounted on or embedded in the substrate, a plurality of power supply terminals that are provided on the LSI chip, one or more source voltage supply terminals which are provided on one of main surfaces of the substrate, and whose number is smaller than a number of the plurality of power supply terminals, and a capacitor element which is embedded in the substrate and a first end of which is earthed, wherein at least one of the source voltage supply terminals is connected to at least two of the plurality of power supply terminals on the LSI chip, in such a manner that a power supply path connected to the at least one source voltage supply terminal branches into at least two power supply paths in the substrate, and a second end of the capacitor element is connected to the power supply path at a point before the power supply path branches. Also, an embodiment of the present invention is an LSI package comprising a substrate, an LSI chip that is mounted on or embedded in the substrate, a plurality of power supply terminals on the LSI chip, and one or more source voltage supply terminals which are provided on one of main surfaces of the substrate, and whose number is smaller than a number of the plurality of power supply terminals, wherein a power supply path connected to at least one of the source voltage supply terminals branches into at least two power supply paths in the substrate, so as to be connected to at least two of the power supply terminals on the LSI chip, and a capacitor element is embedded in the substrate, connected to at least one of the at least two power supply paths at a first end thereof, and earthed at a second end thereof. When a switching operation occurs in an internal circuit in an LSI chip, high-frequency currents are generated at a power supply terminal on an LSI chip. Such high-frequency currents cause a voltage fall. According to the present invention, however, the impact of the voltage fall is eliminated by a capacitor element embedded in an LSI package. Therefore, the number of source voltage supply terminals provided on an LSI package can be set smaller than that of power supply terminals provided on an LSI chip. As a consequence, a pitch of terminals as whole, including signal terminals, on an LSI package can be, more or less, increased. This makes board designing easier without increasing the size of a surface of a board of an LSI package on which terminals are to be provided. In addition, unnecessary electromagnetic radiation from an LSI package can be stopped. The present invention can be effectively applied for LSI packages of BGA and CSP types.

Also, as the capacitor element is directly connected to the terminals on the LSI chip, a path for the high-frequency currents can be made remarkably short. This effectively suppresses unnecessary electromagnetic radiation. Since a direct-current voltage conversion element is provided, a voltage of a different level can be applied to some of the terminals on the LSI chip. Since an inductance element is provided, unnecessary electromagnetic radiation can be suppressed more effectively, and noise from outside can be prevented. Since a conductive board is provided and essential elements such as the LSI chip are enclosed by vias, unnecessary electromagnetic radiation from the LSI package can be reduced and radiation noise from outside can be prevented.

What is claimed is:

1. An LSI package comprising:
a substrate;
an LSI chip that is mounted on or embedded in the substrate;
a plurality of power supply terminals that are provided on the LSI chip;
one or more source voltage supply terminals which are provided on one of the main surfaces of the substrate, and whose number is smaller than a number of the plurality of power supply terminals; and
a capacitor element which is embedded in the substrate and a first end of which is earthed, wherein
at least one of the source voltage supply terminals is connected to at least two of the plurality of power supply terminals on the LSI chip, in such a manner that a power supply path connected to the at least one source voltage supply terminal branches into at least two power supply paths in the substrate,
a second end of the capacitor element is connected to the power supply path at a point before the power supply path branches,
at least one of the plurality of power supply terminals requires a direct-current voltage of a different level than a direct-current voltage applied to a rest of the power supply terminals, and the at least one power supply terminal is connected, through a direct-current voltage conversion element that is embedded in or mounted on the substrate, to one of the source voltage supply terminals to which a different power supply terminal is also connected.

2. The LSI package of claim 1, wherein
the LSI chip is embedded in the substrate, and
a first conductive board is provided, in the substrate, above the LSI chip and the capacitor element, and connected to earth terminals provided in the substrate.

3. An LSI package comprising:
a substrate;
an LSI chip that is mounted on or embedded in the substrate;
a plurality of power supply terminals that are provided on the LSI chip;
one or more source voltage supply terminals which are provided on one of main surfaces of the substrate, and whose number is smaller than a number of the plurality of power supply terminals; and
a capacitor element which is embedded in the substrate and a first end of which is earthed, wherein
at least one of the source voltage supply terminals is connected to at least two of the plurality of power supply terminals on the LSI chip, in such a manner that a power supply path connected to the at least one source voltage supply terminal branches into at least two power supply paths in the substrate,
a second end of the capacitor element is connected to the power supply path at a point before the power supply path branches, and
an inductance element is embedded in the substrate, in such a manner that the inductance element is disposed between (i) an electrode at the second end of the capacitor element and (ii) the at least one source voltage supply terminal so as to be connected to the electrode and the at least one source voltage supply terminal.

4. An LSI package comprising:
a substrate;
an LSI chip that is embedded in the substrate;
a plurality of power supply terminals that are provided on the LSI chip;
one or more source voltage supply terminals which are provided on one of main surfaces of the substrate, and whose number is smaller than a number of the plurality of power supply terminals; and
a capacitor element which is embedded in the substrate and a first end of which is earthed, wherein
at least one of the source voltage supply terminals is connected to at least two of the plurality of power supply terminals on the LSI chip, in such a manner that a power supply path connected to the at least one source voltage supply terminal branches into at least two power supply paths in the substrate,
a second end of the capacitor element is connected to the power supply path at a point before the power supply path branches,
a first conductive board is provided, in the substrate, above the LSI chip and the capacitor element, and connected to earth terminals provided in the substrate,
a second conductive board is provided, in the substrate, below the LSI chip and the capacitor element, so as to oppose the first conductive board, and the first conductive board is connected to the second conductive board by a plurality of vias that run through the substrate and are arranged near a periphery of the substrate.

5. An LSI package comprising: a substrate;
an LSI chip that is mounted on the substrate;
a plurality of power supply terminals that are provided on the LSI chip;
one or more source voltage supply terminals which are provided on one of main surfaces of the substrate, and whose number is smaller than a number of the plurality of power supply terminals; and
a capacitor element which is embedded in the substrate and a first end of which is earthed, wherein
at least one of the source voltage supply terminals is connected to at least two of the plurality of power supply terminals on the LSI chip, in such a manner that a power supply path connected to the at least one source voltage supply terminal branches into at least two power supply paths in the substrate,
a second end of the capacitor element is connected to the power supply path at a point before the power supply path branches,
the substrate is composed of a first layer formed by a multilayer circuit board, a second layer formed by a board, and a third layer formed by a board,
the LSI chip is mounted on one surface of the multilayer circuit board of the first layer, and the at least two power supply paths are integrated into the power supply path in the multilayer circuit board of the first layer,
the capacitor element is embedded in the board of the second layer that is provided on other surface of the multilayer circuit board of the first layer, and
the board of the third layer is provided on one surface of the board of the second layer, and the source voltage supply terminals are provided on one surface of the board of the third layer.

6. The LSI package of claim 5, wherein
the board of the second layer is formed by layering a plurality of thermosetting resin films on one another, and
a depression is formed in the board of the second layer to embed the capacitor element.

7. An LSI package comprising:
a substrate;
an LSI chip that is mounted on or embedded in the substrate;
a plurality of power supply terminals that are provided on the LSI chip;
one or more source voltage supply terminals which are provided on one of main surfaces of the substrate, and whose number is smaller than a number of the plurality of power supply terminals; and
a plurality of capacitor elements which are embedded in the substrate, wherein
at least one of the source voltage supply terminals is connected to at least two of the power supply terminals, and
each of the at least two power supply terminals and a corresponding earth terminal are directly connected to electrodes at both ends of one of the capacitor elements respectively using a conductive bump, and
a distance between the power supply terminal and the corresponding earth terminal is set so as to be equal to a distance between the electrodes at the both ends of the capacitor element.

8. The LSI package of claim 7, wherein
the at least one source voltage supply terminal is connected to the at least two power supply terminals on the LSI chip, in such a manner that a power supply path connected to the source voltage supply terminal branches into at least two power supply paths in the substrate.

9. An LSI package comprising:
a substrate;
an LSI chip that is mounted on the substrate;
a plurality of power supply terminals that are provided on the LSI chip; one or more source voltage supply terminals which are provided on one of main surfaces of the substrate, and whose number is smaller than a number of the plurality of power supply terminals; and
a plurality of capacitor elements which are embedded in the substrate, wherein
at least one of the source voltage supply terminals is connected to at least two of the power supply terminals, and
each of the at least two power supply terminals and a corresponding earth terminal are directly connected to electrodes at both ends of one of the capacitor elements respectively,
the substrate includes a board and a multilayer circuit board,
the LSI chip is mounted on one surface of the board and the plurality of capacitor elements are embedded in the board, and
the multilayer circuit board is provided on other surface of the board, the source voltage supply terminals are provided on the multilayer circuit board, and power supply paths connected to the at least two power supply terminals are integrated into one power supply path in the multilayer circuit board.

10. The LSI package of claim 9, wherein
the LSI chip and the board are covered by resin.

* * * * *